United States Patent
Meng et al.

(10) Patent No.: US 12,232,357 B2
(45) Date of Patent: Feb. 18, 2025

(54) DISPLAY DEVICE AND DISPLAY APPARATUS

(71) Applicant: BOE Technology Group Co., Ltd., Beijing (CN)

(72) Inventors: Xianqin Meng, Beijing (CN); Xiaochuan Chen, Beijing (CN); Wei Wang, Beijing (CN); Can Wang, Beijing (CN); Weiting Peng, Beijing (CN); Sen Ma, Beijing (CN); Yishan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 403 days.

(21) Appl. No.: 17/639,189

(22) PCT Filed: Mar. 24, 2020

(86) PCT No.: PCT/CN2020/080982
§ 371 (c)(1),
(2) Date: Feb. 28, 2022

(87) PCT Pub. No.: WO2021/189271
PCT Pub. Date: Sep. 30, 2021

(65) Prior Publication Data
US 2022/0328796 A1    Oct. 13, 2022

(51) Int. Cl.
*H01L 21/78* (2006.01)
*H10K 50/856* (2023.01)
(Continued)

(52) U.S. Cl.
CPC .......... *H10K 50/86* (2023.02); *H10K 50/856* (2023.02); *H10K 59/38* (2023.02)

(58) Field of Classification Search
CPC ...... H10K 50/86; H10K 50/856; H10K 59/38; H10K 59/878; H10K 59/8791; G02B 5/3058; G02B 27/286
(Continued)

(56) References Cited

U.S. PATENT DOCUMENTS 7,012,365 B2 *  3/2006  Adachi ................ H10K 50/868
                                                            313/506
8,379,172 B2 *  2/2013  Nagata .............. G02F 1/133514
                                                            349/106
(Continued)

FOREIGN PATENT DOCUMENTS

CN         1851539 A         10/2006
CN       101777289 A          7/2010
(Continued)

OTHER PUBLICATIONS

Supplementary Partial European Search Report, mailed Oct. 31, 2022, from European App. No. 20928015.5.
(Continued)

*Primary Examiner* — Vu A Vu
(74) *Attorney, Agent, or Firm* — Workman Nydegger

(57) ABSTRACT

Disclosed in the present disclosure are a display device and a display apparatus. The display device includes: a first substrate and a second substrate opposite to the first substrate, a light-emitting pixel array between the first substrate and the second substrate, a reflective plate at a backlight side of the light-emitting pixel array, and a polarization conversion structure and a polarization filtering structure which are successively arranged at a light emission side of the light-emitting pixel array; the polarization filtering structure is for filtering light emitted from the light-emitting pixel array side to the polarization filtering structure, so that target polarized light is transmitted, and non-target deflected light is reflected back; and the polarization conversion structure is for con-
(Continued)

verting transmitted circularly polarized light into linearly polarized light, or converting transmitted linearly polarized light into circularly polarized light.

17 Claims, 9 Drawing Sheets

(51) Int. Cl.
 *H10K 50/86* (2023.01)
 *H10K 59/38* (2023.01)
(58) Field of Classification Search
 USPC .......................................................... 257/40
 See application file for complete search history.

(56) References Cited

U.S. PATENT DOCUMENTS

| | | | |
|---|---|---|---|
| 9,696,475 | B2 * | 7/2017 | Hatanaka ............. G02B 5/3016 |
| 10,866,445 | B2 * | 12/2020 | Tomikawa ......... G02F 1/133553 |
| 2002/0093284 | A1 | 7/2002 | Adachi et al. |
| 2007/0183035 | A1 * | 8/2007 | Asakawa ............ G03F 7/70316 |
| | | | 359/485.05 |
| 2010/0177265 | A1 | 7/2010 | Jung et al. |
| 2010/0182552 | A1 | 7/2010 | Park et al. |
| 2010/0238548 | A1 | 9/2010 | Watanabe et al. |
| 2011/0261461 | A1 | 10/2011 | Le et al. |
| 2015/0325816 | A1 | 11/2015 | Haag et al. |
| 2017/0351017 | A1 | 12/2017 | Cui et al. |
| 2019/0087047 | A1 * | 3/2019 | Zou ....................... G06F 3/0446 |
| 2019/0089880 | A1 | 3/2019 | Murao |
| 2019/0185743 | A1 | 6/2019 | Kim et al. |
| 2019/0377176 | A1 | 12/2019 | Sharp |

FOREIGN PATENT DOCUMENTS

| | | |
|---|---|---|
| CN | 101783360 A | 7/2010 |
| CN | 110632697 A | 12/2019 |
| CN | 110764265 A | 2/2020 |
| JP | 2002-215067 A | 7/2002 |
| JP | 2003-502708 A | 1/2003 |
| JP | 2008242349 A | 10/2008 |
| JP | 2010-015109 A | 1/2010 |
| JP | 2010-161051 A | 7/2010 |
| JP | 2010-170988 A | 8/2010 |
| JP | 2010225307 A | 10/2010 |
| JP | 2016-054153 A | 4/2016 |
| JP | 2017-003879 A | 1/2017 |
| JP | 2019-053227 A | 4/2019 |
| JP | 2019-105844 A | 6/2019 |
| JP | 2019-109515 A | 7/2019 |
| WO | 2000/79317 A1 | 12/2000 |

OTHER PUBLICATIONS

Japanese Office Action, mailed Jan. 6, 2024, from Japanese App. No. 2022-527725, 26 pages.
Chinese Office Action, mailed Apr. 6, 2022, from Chinese Patent Application 202080000362.4.
Chinese Decision of Rejection, mailed Jun. 2, 2022, from Chinese Patent Application 202080000362.4.

* cited by examiner

DISPLAY DEVICE AND DISPLAY APPARATUS

CROSS-REFERENCE TO RELATED APPLICATION

This application is a national phase entry under 35 U.S.C. § 371 of International Application No. PCT/CN2020/080982, filed Mar. 24, 2020.

FIELD

The present disclosure relates to the field of display, in particular to a display device and a display apparatus.

BACKGROUND

Near-eye display (NED) equipment such as head mounted display (HMD) equipment have recently been introduced into the consumer market to support visualization technologies such as augmented reality (AR) and virtual reality (VR).

Waveguides may be used in the NED equipment, so as to send light representing artificially generated images from image generating components of the equipment to users'eyes. For example, waveguide grating AR glasses shown in FIG. 1 are based on a waveguide 3. After compressing the content in a micro display screen 1, it is coupled into the waveguide 3 through a coupling-in grating 2, after transmission in the waveguide 3, at a coupling-out position (namely within the observation range of human eyes), screen optical information is coupled out through a coupling-out grating 4.

However, current AR display equipment has the problems of low brightness and low light utilization efficiency.

SUMMARY

In view of this, embodiments of the present disclosure provide a display device and a display apparatus, and the specific solutions are as follows.

On one aspect, the embodiments of the present disclosure provide a display device, including: a first substrate and a second substrate opposite to the first substrate, a light-emitting pixel array between the first substrate and the second substrate, a reflective plate at a backlight side of the light-emitting pixel array, and a polarization conversion structure and a polarization filtering structure which are successively arranged at a light emission side of the light-emitting pixel array;

the polarization filtering structure is for filtering light emitted from a light-emitting pixel array side to the polarization filtering structure to transmit target polarized light, and reflect back non-target deflected light; and the polarization conversion structure is for converting transmitted circularly polarized light into linearly polarized light, or converting transmitted linearly polarized light into the circularly polarized light.

Optionally, in the display device provided by the embodiments of the present disclosure, the polarization filtering structure is one of a semi-reflecting and semi-transmitting nanowire grid structure, a semi-reflecting and semi-transmitting photonic crystal nanostructure, a semi-reflecting and semi-transmitting metamaterial nanostructure, or a semi-reflecting and semi-transmitting polarization band-pass filtering film.

Optionally, in the display device provided by the embodiments of the present disclosure, the polarization filtering structure is the semi-reflecting and semi-transmitting nanowire grid structure; and a material of the semi-reflecting and semi-transmitting nanowire grid structure is a metal material.

Optionally, in the display device provided by the embodiments of the present disclosure, the material of the semi-reflecting and semi-transmitting nanowire grid structure is aluminum, argentum, aurum or cuprum.

Optionally, in the display device provided by the embodiments of the present disclosure, a ratio of a wire width to a grating pitch of the semi-reflecting and semi-transmitting nanowire grid structure is 20%-80%.

Optionally, in the display device provided by the embodiments of the present disclosure, the grating pitch of the semi-reflecting and semi-transmitting nanowire grid structure is 40 nm, the wire width of the semi-reflecting and semi-transmitting nanowire grid structure is 20 nm, and a wire height of the semi-reflecting and semi-transmitting nanowire grid structure is 200 nm.

Optionally, in the display device provided by the embodiments of the present disclosure, when the polarization filtering structure is the semi-reflecting and semi-transmitting nanowire grid structure, or the semi-reflecting and semi-transmitting photonic crystal nanostructure or the semi-reflecting and semi-transmitting metamaterial nanostructure; and the display device further includes:

a packaging layer covering the polarization filtering structure, and a refractive index of the packaging layer is smaller than a refractive index of the polarization filtering structure.

Optionally, in the display device provided by the embodiments of the present disclosure, a polarization conversion efficiency of the polarization conversion structure is greater than 40%.

Optionally, in the display device provided by the embodiments of the present disclosure, the polarization conversion structure is a quarter-wave plate or a dual brightness enhancement film.

Optionally, in the display device provided by the embodiments of the present disclosure, the second substrate is at the light emission side of the light-emitting pixel array; and the polarization conversion structure and the polarization filtering structure are both arranged at a side, facing away from the light-emitting pixel array, of the second substrate, and the polarization conversion structure is between the polarization filtering structure and the second substrate.

Optionally, in the display device provided by the embodiments of the present disclosure, the second substrate is at the light emission side of the light-emitting pixel array; and the polarization conversion structure and the polarization filtering structure are both arranged between the second substrate and the light-emitting pixel array, and the polarization filtering structure is between the polarization conversion structure and the second substrate.

Optionally, in the display device provided by the embodiments of the present disclosure, the second substrate is at the light emission side of the light-emitting pixel array;

the polarization filtering structure is at a side, facing away from the light-emitting pixel array, of the second substrate; and the polarization conversion structure is between the second substrate and the light-emitting pixel array.

Optionally, the display device provided by the embodiments of the present disclosure further includes a color film layer arranged between the light-emitting pixel array and the second substrate;

the polarization conversion structure and the polarization filtering structure are both arranged at a side, facing the light-emitting pixel array, of the color film layer; or the polarization conversion structure and the polarization filtering structure are both arranged at a side, facing away from the light-emitting pixel array, of the color film layer; or the polarization conversion structure is between the color film layer and the light-emitting pixel array, and the polarization filtering structure is at the side, facing away from the light-emitting pixel array, of the color film layer.

Optionally, in the display device provided by the embodiments of the present disclosure, the display device is an OLED display device, a mini-LED display device, a micro-LED display device, a quantum dot display device or a reflective display device.

On another aspect, the embodiments of the present disclosure further provides a display device, including the above any display device provided by the embodiments of the present disclosure.

DETAILED DESCRIPTION OF THE EMBODIMENTS

Figure 1:
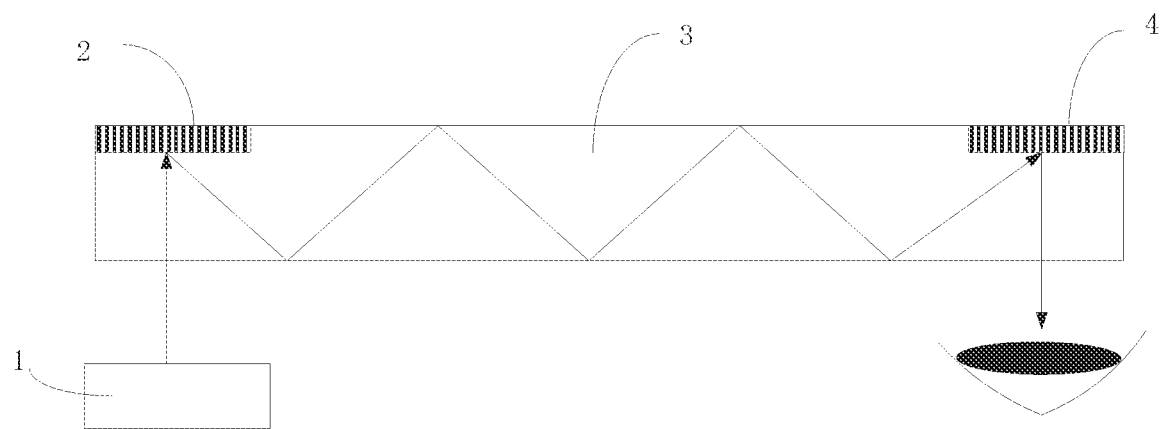
FIG. 1 is a schematic structural diagram of waveguide grating AR glasses in the related art.
Figure 2A:
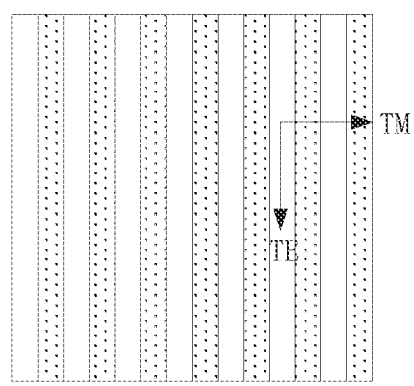
FIG. 2A is a top view of a one-dimensional metal grating in an embodiment of the present disclosure.
Figure 2B:
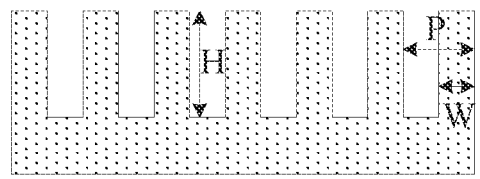
FIG. 2B is a sectional view of the one-dimensional metal grating shown in FIG. 2A.
Figure 3:
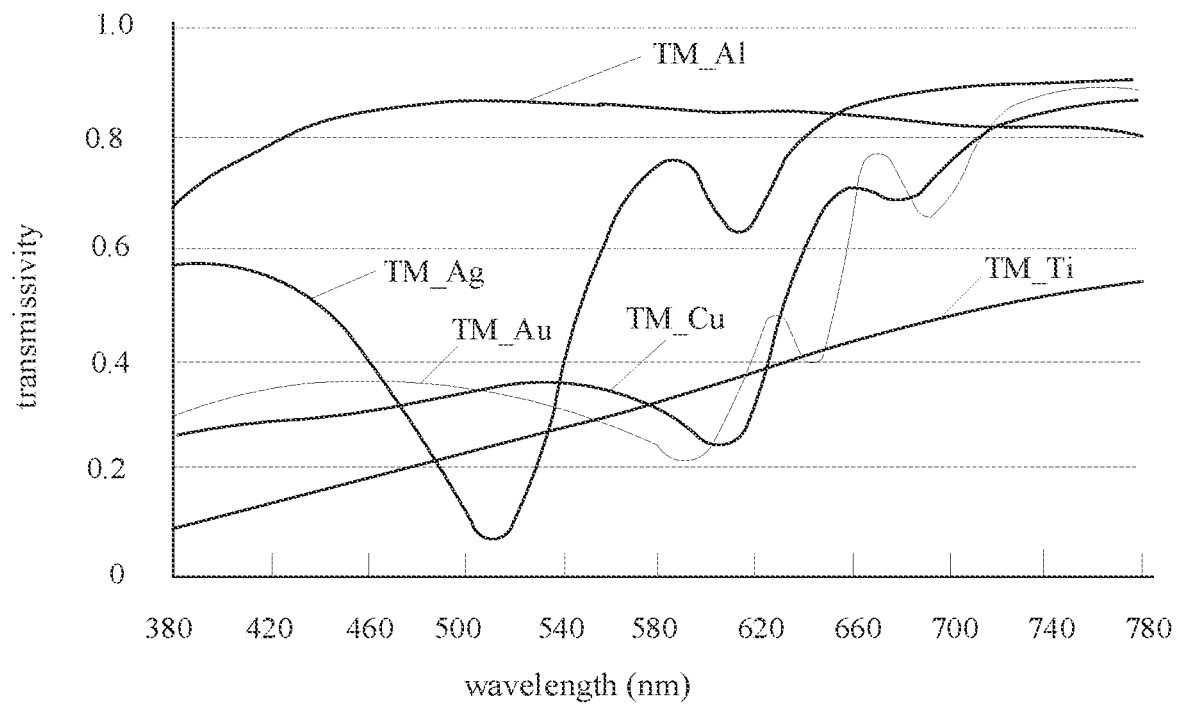
FIG. 3 is a simulation result of response of a one-dimensional metal grating to a TM polarization state and a TE polarization state respectively provided by an embodiment of the present disclosure.

Specifically, since a one-dimensional grating has a strong dependence on the polarization of incident light, that is, the response to the polarization perpendicular to the grating direction is obvious, and the polarization in a direction parallel to the grating direction has basically no obvious modulation. Taking the one-dimensional metal grating shown in FIG. 2A and FIG. 2B as an example, a grating pitch P, a wire width W and a wire height H are respectively 100 nm, 50 nm and 150 nm. Different metal materials such as aluminum (Al), titanium (Ti), argentum (Ag), aurum (Au) and cuprum (Cu) are simulated respectively, optical software modeling based on solving Maxwell equation in a time domain and a frequency domain is utilized to solve the electromagnetic field distribution of the one-dimensional grating formed by the above materials. When an electric field direction of the incident light is perpendicular to the one-dimensional grating, it is a TM polarization state, and when the electric field direction is parallel to the on-dimensional grating, it is a TE polarization state. From the simulation result of FIG. 3, it can be seen that the response of the TM polarization state perpendicular to the grating is obvious, and the TE polarization state in the direction parallel to the grating direction has no obvious modulation, that is, light in the TM polarization state may have an obvious effect on a grating material, and light in the TE polarization state has basically no obvious response to the material.

It is for the above reasons that current AR equipment mainly polarizes light of a non-polarized light source on a display screen, non-polarized light is absorbed, interference caused by the uncontrollability of its light is avoided, and target polarized light is accurately controlled for imaging. However, taking the display screen as an OLED as an example, a limit value of the light that can be effectively utilized by the non-polarized light source emitted by the OLED is generally about 50% of luminous brightness. After transmission through a coupling-in grating, a coupling-out grating and a waveguide, the effective utilization rate of OLED screen light is only 3%-4%. If the luminous brightness of the OLED is 3000 nit, the brightness of AR display equipment is only 45 nit-60 nit, which is an impossible task for outdoor application of the AR display equipment.

Therefore, based on this, embodiments of the present disclosure provide a display device and a display device, so as to achieve a display device with high brightness and single polarization.

In order to make the above objects, features and advantages of the present disclosure more clearly understood, the present disclosure will be further described below with reference to the accompanying drawings and the embodiments. Example implementations, however, can be implemented in various forms and should not be construed as limited to the implementations set forth herein; rather, these implementations are provided so that the present disclosure is more thorough and complete, and will fully convey the concept of the example implementations to those skilled in the art. The same reference numerals in the drawings denote same or similar structures, and thus their repeated descriptions will be omitted. Words expressing the position and direction described in the present disclosure are all illustrated by taking the accompanying drawings as examples, but changes can also be made as required, and the changes are all included in the protection scope of the present disclosure. The drawings of the present disclosure are only used to illustrate the relative positional relationship and do not represent actual scales.

It should be noted that specific details are set forth in the following description in order to facilitate a thorough understanding of the present disclosure. However, the present disclosure can be implemented in many other ways different from those described herein, and those skilled in the art can make similar promotions without departing from the connotation of the present disclosure. Accordingly, the present disclosure is not limited by the specific implementations disclosed below. Subsequent descriptions in the specification are preferred implementations for implementing the present application. However, the descriptions are for the purpose of illustrating the general principles of the present application and are not intended to limit the scope of the present application. The protection scope of the present application should be subject to those defined in appended claims.

The display device and the display device provided by the embodiments of the present disclosure are described in detail below with reference to the accompanying drawings.

Figure 4:
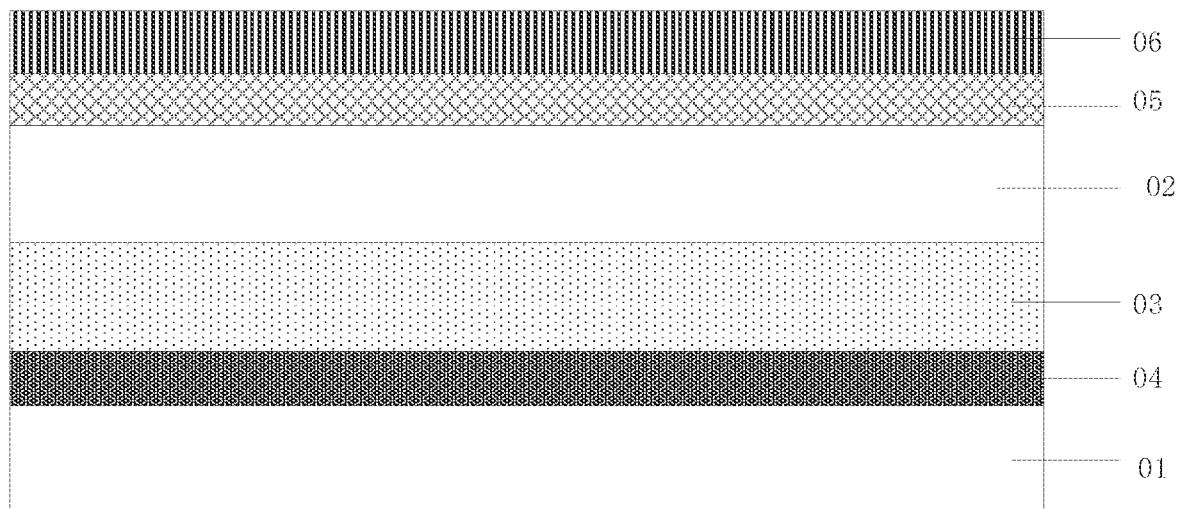
FIG. 4 is a schematic structural diagram of a display device provided by an embodiment of the present disclosure.
Figure 5:
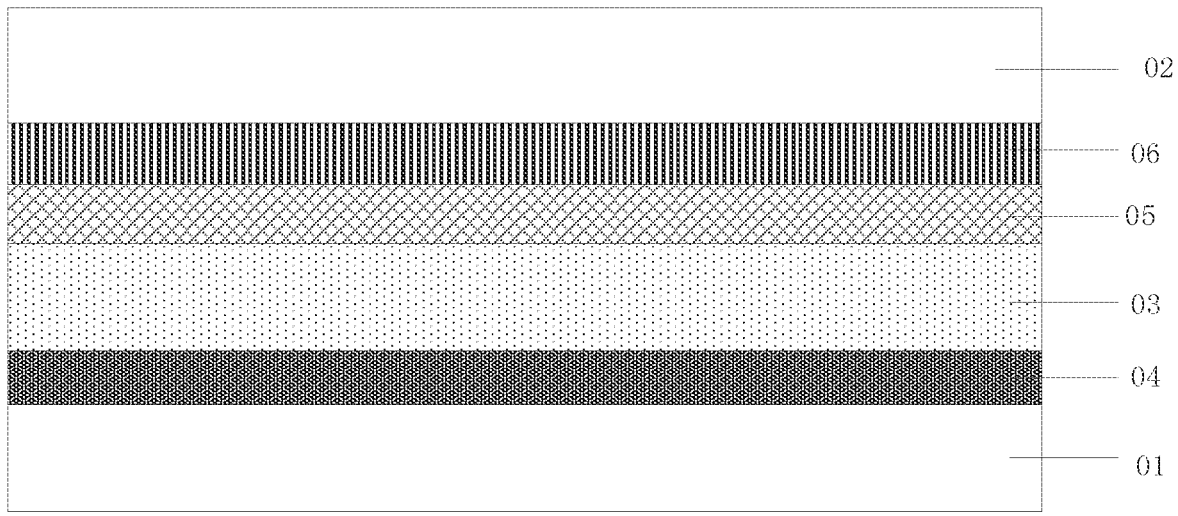
FIG. 5 is a schematic structural diagram of another display device provided by an embodiment of the present disclosure.
Figure 6:
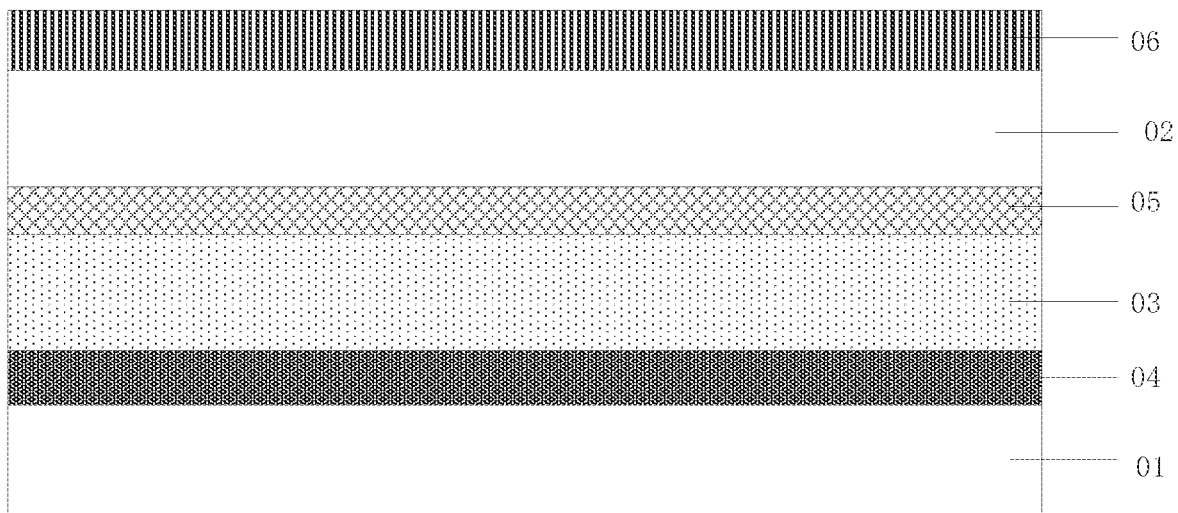
FIG. 6 is a schematic structural diagram of yet another display device provided by an embodiment of the present disclosure.

The display device provided by the embodiments of the present disclosure, as shown in FIG. 4 to FIG. 6, includes: a first substrate 01 and a second substrate 02 opposite to the first substrate, a light-emitting pixel array 03 between the first substrate 01 and the second substrate 02, a reflective plate 04 at a backlight side of the light-emitting pixel array 03, and a polarization conversion structure 05 and a polarization filtering structure 06 which are successively arranged at a light emission side of the light-emitting pixel array 03;

the polarization filtering structure 06 is for filtering light emitted from a light-emitting pixel array 03 side to the polarization filtering structure 06 to transmit the target polarized light, and reflect back non-target deflected light; and the polarization conversion structure 05 is for converting transmitted circularly polarized light into linearly polarized light, or converting transmitted linearly polarized light into the circularly polarized light.

The display device provided by the embodiments of the present disclosure, includes: the first substrate and the second substrate opposite to the first substrate, the light-emitting pixel array between the first substrate and the second substrate, the reflective plate at the backlight side of the light-emitting pixel array, and the polarization conversion structure and the polarization filtering structure which are successively arranged at the light emission side of the light-emitting pixel array. In this way, after non-polarized light emitted by the light-emitting pixel array passes through the polarization conversion structure, the non-polarized light is still the non-polarized light, when the non-polarized light reaches the polarization filtering structure, the target polarized light in the non-polarized light conforming to the polarization filtering structure is filtered out of the display device, and the non-target deflected light is reflected back into the display device. The light reflected back into the display device is the non-target deflected light and is the linearly polarized light, the linearly polarized light is converted into the circularly polarized light after passing through the polarization conversion structure. The circularly polarized light is reflected back after reaching the reflective plate, at this time, the reflected light is still the circularly polarized light. The reflected circularly polarized light is converted into the linearly polarized light after passing through the polarization conversion structure, a difference between a polarization direction of the linearly polarized light and the first reflected linearly polarized light is $\pi/2$, and the linearly polarized light is just the target polarized light which may be transmitted through the polarization filtering structure. Therefore, the display device provided by the embodiments of the present disclosure can increase the brightness of single polarization light.

During implementation, when the display device provided by the embodiments of the present disclosure is applied to AR equipment, theoretically, the light emission brightness that can be effectively utilized by the AR equipment will be twice an existing one.

The present disclosure will be described in detail below with reference to specific embodiments. It should be noted that the embodiments is for better explanation of the present disclosure, but does not limit the present disclosure.

Optionally, in the display device provided by the embodiments of the present disclosure, as shown in FIG. 4, a second substrate 02 is at a light emission side of a light-emitting pixel array 03; and a polarization conversion structure 05 and a polarization filtering structure 06 are both at a side, facing away from the light-emitting pixel array 03, of the second substrate 02, and the polarization conversion structure 05 is between the polarization filtering structure 06 and the second substrate 02.

Or, optionally, in the display device provided by the embodiments of the present disclosure, as shown in FIG. 5, the second substrate 02 is at the light emission side of the light-emitting pixel array 03; and the polarization conversion structure 05 and the polarization filtering structure 06 are both between the second substrate 02 and the light-emitting pixel array 03, and the polarization filtering structure 06 is between the polarization conversion structure 05 and the second substrate 02.

Or, optionally, in the display device provided by the embodiments of the present disclosure, as shown in FIG. 6, the second substrate 02 is at the light emission side of the light-entitling pixel array 03; the polarization filtering structure 06 is at the side, facing away from the light-emitting pixel array 03, of the second substrate 02; and the polarization conversion structure 05 is between the second substrate 02 and the light-emitting pixel array 03.

During implementation, in the display device provided by the embodiment of the present disclosure, light emitted by the light-emitting pixel array may be colored light including three primary colors of RGB. In this case, due to the separate control of pixels of different colors, there is no crosstalk among different pixels, especially for a display device structure with high ppi, the high ppi and a high contrast can be better achieved.

Further, in the display device provided by the embodiments of the present disclosure, when the light emitted by the light-emitting pixel array is white light, as shown in FIG. 7 to FIG. 12, the display device provided by the embodiments of the present disclosure further includes a color film layer 07 arranged between the light-emitting pixel array 03 and the second substrate 02.

Figure 7:
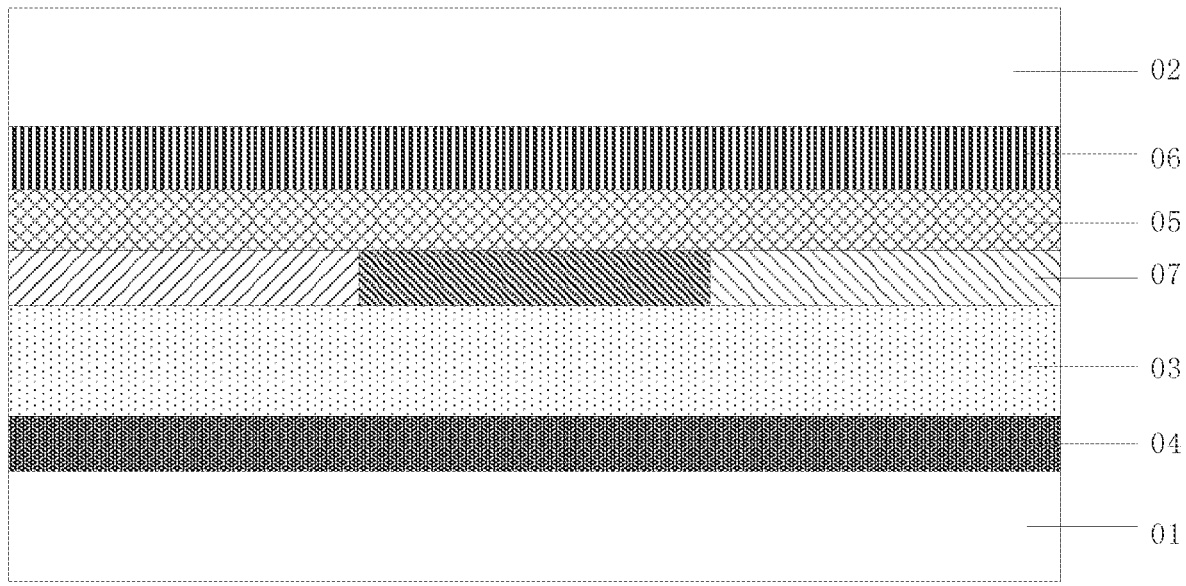
FIG. 7 is a schematic structural diagram of yet another display device provided by an embodiment of the present disclosure.
Figure 8:
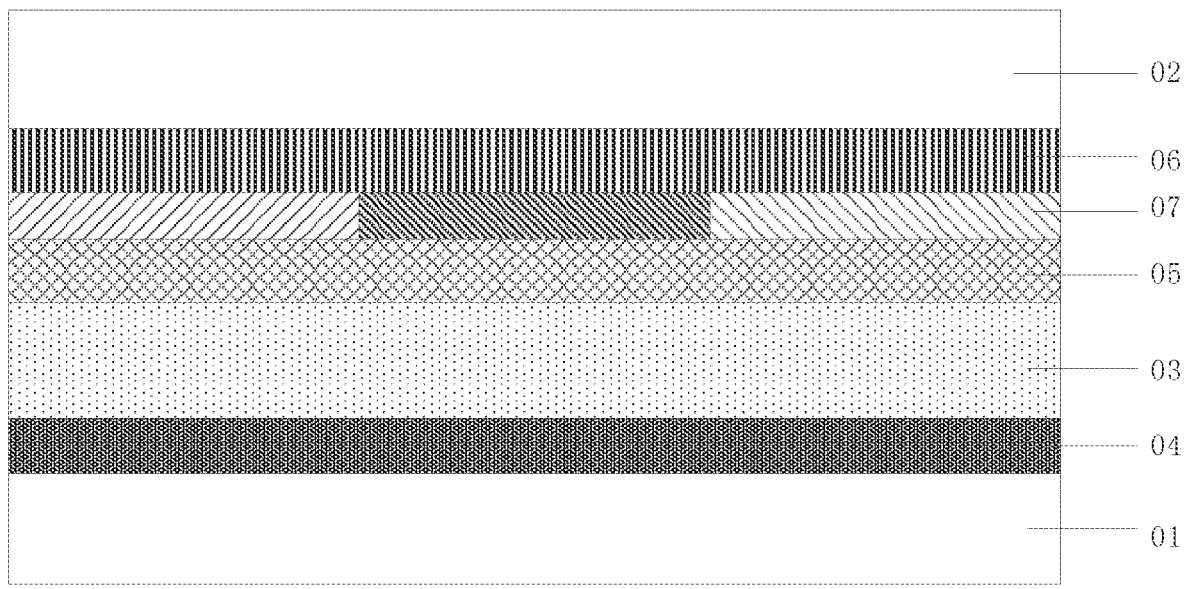
FIG. 8 is a schematic structural diagram of yet another display device provided by an embodiment of the present disclosure.
Figure 9:
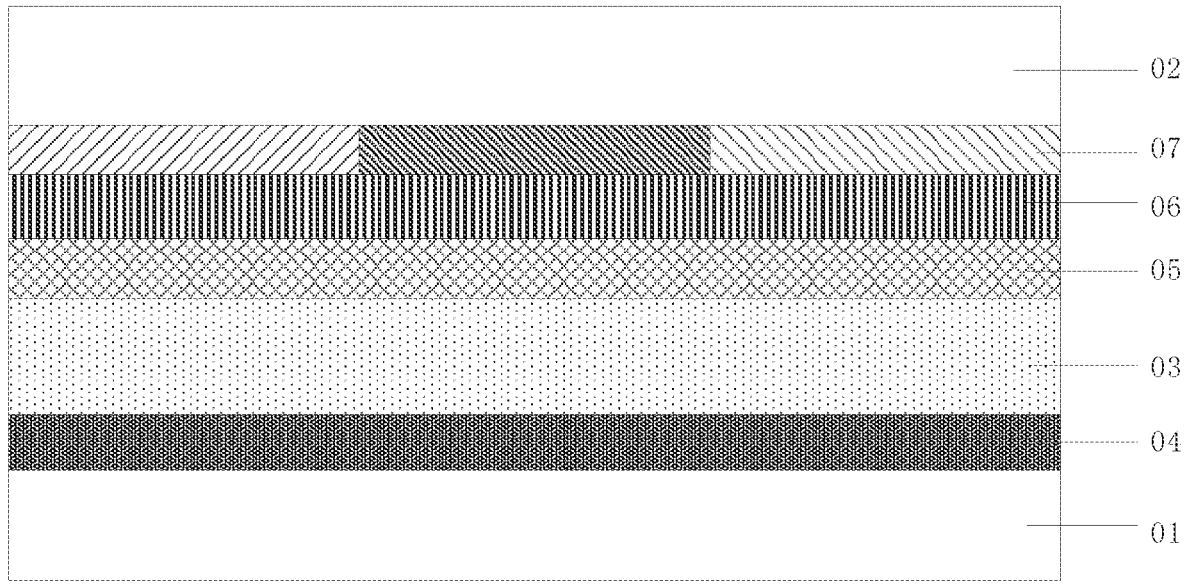
FIG. 9 is a schematic structural diagram of yet another display device provided by an embodiment of the present disclosure.
Figure 10:
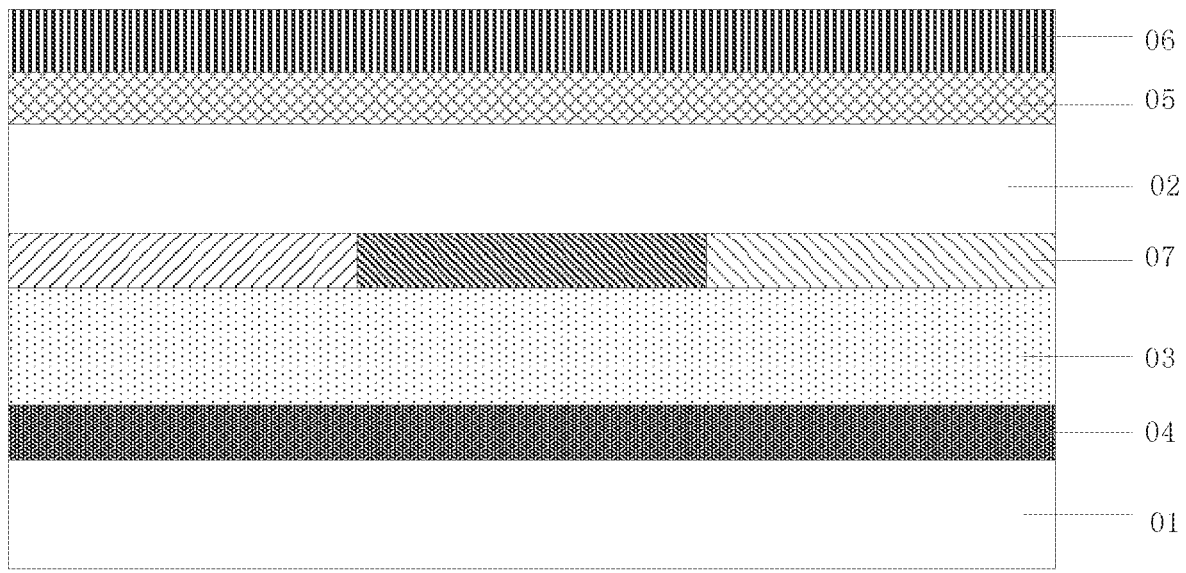
FIG. 10 is a schematic structural diagram of yet another display device provided by an embodiment of the present disclosure.
Figure 11:
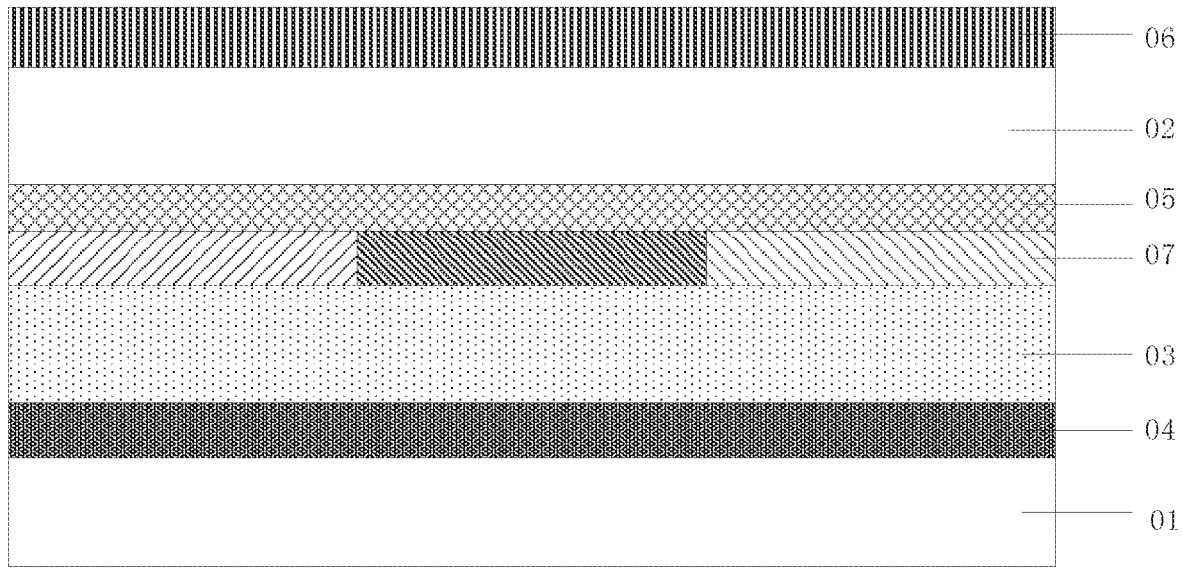
FIG. 11 is a schematic structural diagram of yet another display device provided by an embodiment of the present disclosure.
Figure 12:
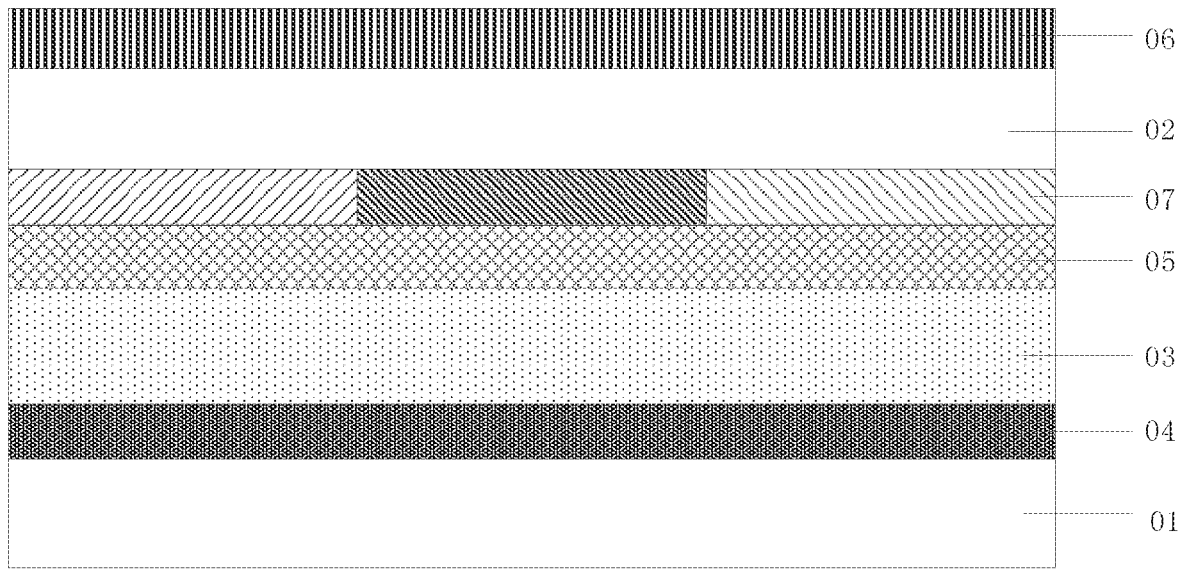
FIG. 12 is a schematic structural diagram of yet another display device provided by an embodiment of the present disclosure.

As shown in FIG. 9, the polarization conversion structure 05 and the polarization filtering structure 06 are both at the side, facing the light-emitting pixel array 03, of the color film layer 07; or as shown in FIG. 7, FIG. 10 and FIG. 11, the polarization conversion structure 05 and the polarization filtering structure 06 are both at the side, facing away from the light-emitting pixel array 03, of the color film layer 07; or as shown in FIG. 8 and FIG. 12, the polarization conversion structure 05 is between the color film layer 07 and the light-emitting pixel array 03, and the polarization filtering structure 06 is at the side, facing away from the light-emitting pixel array 03, of the color film layer 07.

Optionally, in the display device provided by the embodiment of the present disclosure, the display device may be an OLED display device, a mini-LED display device, a micro-LED display device, a quantum dot display device or a reflective display device, which is not limited here.

Specifically, when the display device provided by the embodiments of the present disclosure is the OLED display device, it may be either a bottom emission structure or a top emission structure, which is not limited here.

Further, when the display device provided by the embodiments of the present disclosure is the OLED display device, the light-emitting pixel array mainly includes an anode layer, a light-emitting layer and a cathode layer. The anode layer or the cathode layer is generally used as a reflective electrode, so the reflective electrode may also be multiplexed as a reflective plate.

Optionally, in the display device provided by the embodiments of the present disclosure, a surface of the side, facing away from the light-emitting pixel array, of the second substrate may be modified, so that an interface of emitted light is no longer a smooth surface, thereby achieving an effect of anti-reflection.

In an optional implementation, in order to increase the brightness of the single polarization light, in the display device provided by the embodiments of the present disclosure, the polarization filtering structure not only needs to filter the target polarized light, but also to make the non-polarized light be reflected back to the light-emitting pixel array side, then the non-polarized light is utilized again in combination with the polarization conversion structure, so as to achieve the maximum utilization rate of the light emission of the display device as far as possible.

During implementation, a semi-reflecting and semi-transmitting nanowire grid structure, a semi-reflecting and semi-transmitting photonic crystal nanostructure, a semi-reflecting and semi-transmitting metamaterial nanostructure, or a semi-reflecting and semi-transmitting polarization band-pass filtering film can all achieve the purposes of polarizing and filtering. Specifically, the responsivity (transmissivity) of the target polarized light of different structures, the responsivity (transmissivity) of the non-target polarized light and the direction of the non-target polarized light (including reflection or absorption loss) are shown in Table 1 below. It can be seen from Table 1 that the ideal transmissivity of the above structures is 40-50%, and the reflectivity of the non-target polarized light is about 48%.

TABLE 1

| | Four implementations of the polarization filtering structure | | | |
| --- | --- | --- | --- | --- |
| | semi-reflecting and semi-transmitting polarization band-pass filtering film | semi-reflecting and semi-transmitting nanowire grid structure | semi-reflecting and semi-transmitting photonic crystal nanostructure | semi-reflecting and semi-transmitting metamaterial nanostructure |
| responsivity of target polarized light | ~48% | ~40% | ~49% | ~49% |
| responsivity of non-target polarized light | 0 | 0 | 0 | 0 |
| direction of non-target polarized light | ~48% reflection | ~48% reflection | ~48% reflection | ~48% reflection |

Therefore, optionally, in the display device provided by the embodiments of the present disclosure, the polarization filtering structure is one of the semi-reflecting and semi-transmitting nanowire grid structure, the semi-reflecting and semi-transmitting photonic crystal nanostructure, the semi-reflecting and semi-transmitting metamaterial nanostructure, or the semi-reflecting and semi-transmitting polarization hand-pass filtering film, which is not limited here.

During implementation, from the perspective of process maturity, structural complexity and cost, optionally, in the display device provided by the embodiments of the present disclosure, the polarization filtering structure is the semi-reflecting and semi-transmitting nanowire grid structure; and a material of the semi-reflecting and semi-transmitting nanowire grid structure is a metal material.

During implementation, in the display device provided by the embodiments of the present disclosure, a grating pitch of the semi-reflecting and semi-transmitting nanowire grid structure is smaller than a wavelength of incident light.

Accordingly, the semi-reflecting and semi-transmitting nanowire grid structure is generally formed by etching a plurality of nanometer-scale trenches on a metal substrate.

The transmissivity of the target polarized light of the semi-reflecting and semi-transmitting nanowire grid structure depends on self parameters of a nanowire grid structure and its use conditions. The self parameters of the nanowire grid structure include a material, a wire height (namely a depth of a trench), a grating pitch, a grating wire width (namely a width of a gap between the trenches), etc., of the nanowire grid structure, and use conditions include: a wavelength of the incident light, an incident angle, a polarization state, etc. For the semi-reflecting and semi-transmitting nanowire grid structure in the embodiments of the present disclosure, there are three main structural parameters, which respectively are the grating pitch (P), the duty cycle (W/P) and the metal wire height (H). The grating pitch determines a shortest wavelength at which a wire grid can effectively generate polarization; and the duty cycle, or a filling factor, is a ratio (W/P) of the metal wire width (W) and the grating pitch (P). Its adjustment can achieve the balance between polarization and transmission absorption, for convenient processing, it is generally about 0.5. The metal wire height H has the most obvious influence on the polarization degree, and the larger the H value, the higher the polarization degree.

Optionally, in the display device provided by the embodiments of the present disclosure, the material of the semi-reflecting and semi-transmitting nanowire grid structure may be metal materials such as Al, Ag, Au or Cu, which is not limited here.

Accordingly, in the display device provided by the embodiments of the present disclosure, it is preferable that the material of the semi-reflecting and semi-transmitting nanowire grid structure is Al.

During specific implementation, in the display device provided by the embodiments of the present disclosure, the ratio of the wire width to the grating pitch of the semi-reflecting and semi-transmitting nanowire grid structure is 20%-80%.

Optionally, for convenient processing, in the display device provided by the embodiments of the present disclosure, the ratio of the wire width to the grating pitch of the semi-reflecting and semi-transmitting nanowire grid structure is 50%.

Figure 13:
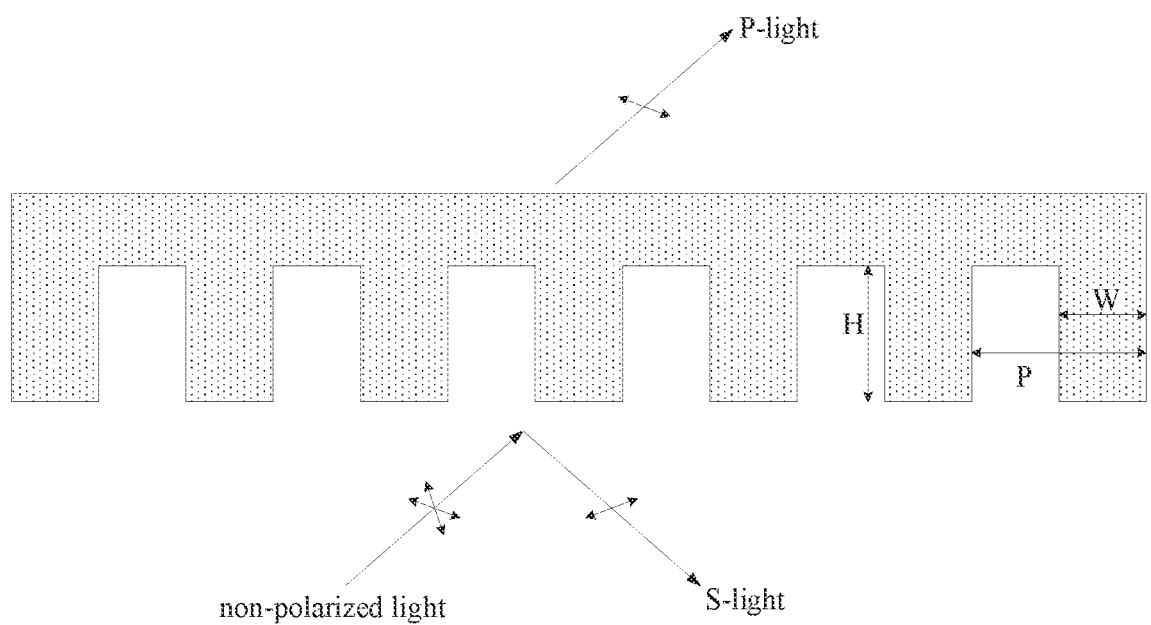
FIG. 13 is a schematic structural diagram of a semi-reflecting and semi-transmitting nanowire grid structure in a display device provided by an embodiment of the present disclosure.

Optionally, in the display device provided by the embodiments of the present disclosure, as shown in FIG. 13, the grating pitch P of the semi-reflecting and semi-transmitting nanowire grid structure is 40 nm, the wire width W of the semi-reflecting and semi-transmitting nanowire grid structure is 20 nm, and the wire height H of the semi-reflecting and semi-transmitting nanowire grid structure is 200 nm.

Figure 14A:
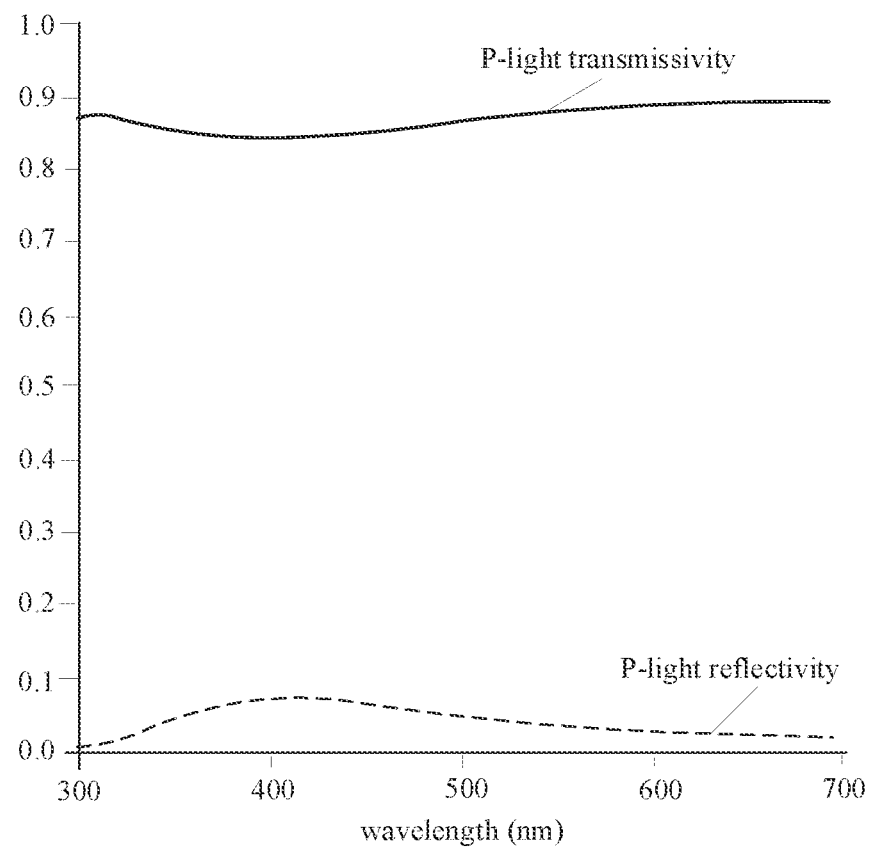
FIG. 14A is a simulation result of a reflectivity and a transmissivity of P-light in the semi-reflecting and semi-transmitting nanowire grid structure shown in FIG. 13.
Figure 14B:
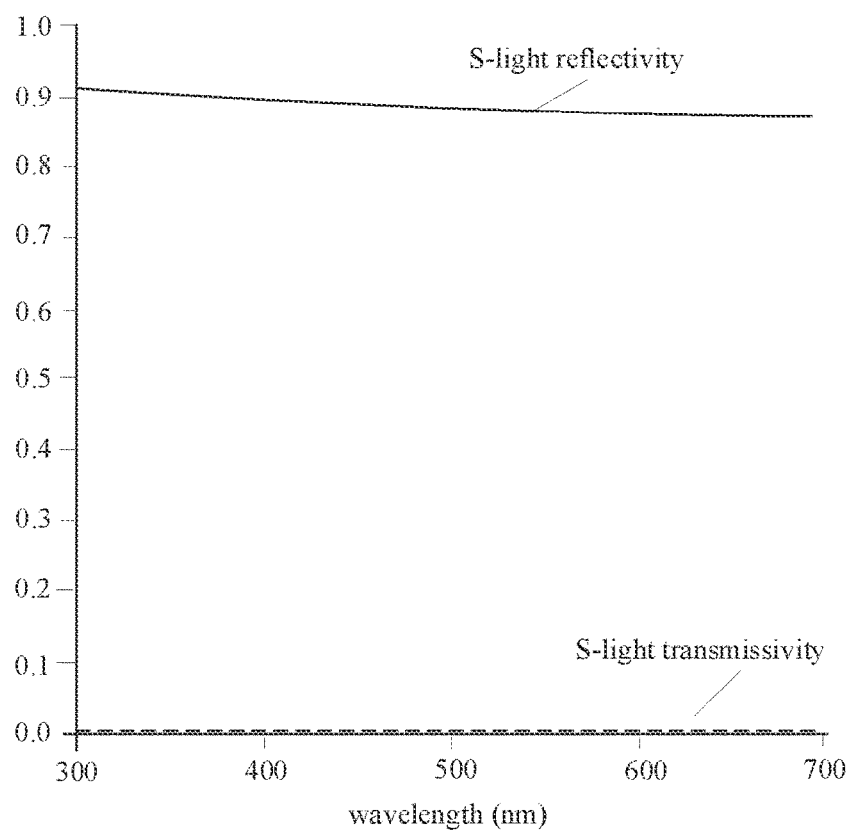
FIG. 14B is a simulation result of a reflectivity and a transmissivity of S-light in the semi-reflecting and semi-transmitting nanowire grid structure shown in FIG. 13.

Accordingly, taking the light-emitting pixel array as an OLED as an example, the light emitted by the OLED is non-polarized light, the non-polarized light is irradiated on the semi-reflecting and semi-transmitting nanowire grid structure shown in FIG. 13, when the incident light is P-light (the target polarized light), the P-light is expected to be completely transmitted, and if it cannot be completely transmitted, the non-transmitted light is expected to be reflected back, that is, the P-light is transmitted at nearly 100%, reflected at 0% and absorbed at 0%. When the incident light is S-light (the non-target polarized light), the S-light is expected to be completely reflected, and if it cannot be completely reflected, the non-reflected light is expected to be absorbed rather than transmitted, so as to avoid unnecessary crosstalk. In optical simulation software FDTD Solution, the transmissivity and the reflectivity of the P-light are simulated and calculated as shown in FIG. 14A, and the transmissivity and the reflectivity of the S-light are as shown in FIG. 14B. It can be seen from FIG. 14A that when the incident light is the P-light, the reflectivity is less than 10% and the transmissivity is close to 90% in the visible light range, that is, the semi-reflecting and semi-transmitting nanowire grid structure provided by the embodiments of the present disclosure can achieve the purpose that in a design target, the P-light is polarized and filtered to pass through, and the other is reflected. It can be seen from FIG. 8b that when the incident light is the S-light, the reflectivity is basically about 90%, and the transmissivity is basically close to 0, that is, the semi-reflecting and semi-transmitting nanowire grid structure provided by the embodiments of the present disclosure can achieve the purpose that in the design target, the S-light is reflected, and the transmission is 0.

Accordingly, assuming that the non-polarized light is simplified to a combination of 50% P-light and 50% S-light, and if the semi-reflecting and semi-transmitting nanowire grid structure is designed to transmit 90% of the P-light, the transmissivity is 50%*90%=45%.

Figure 15:
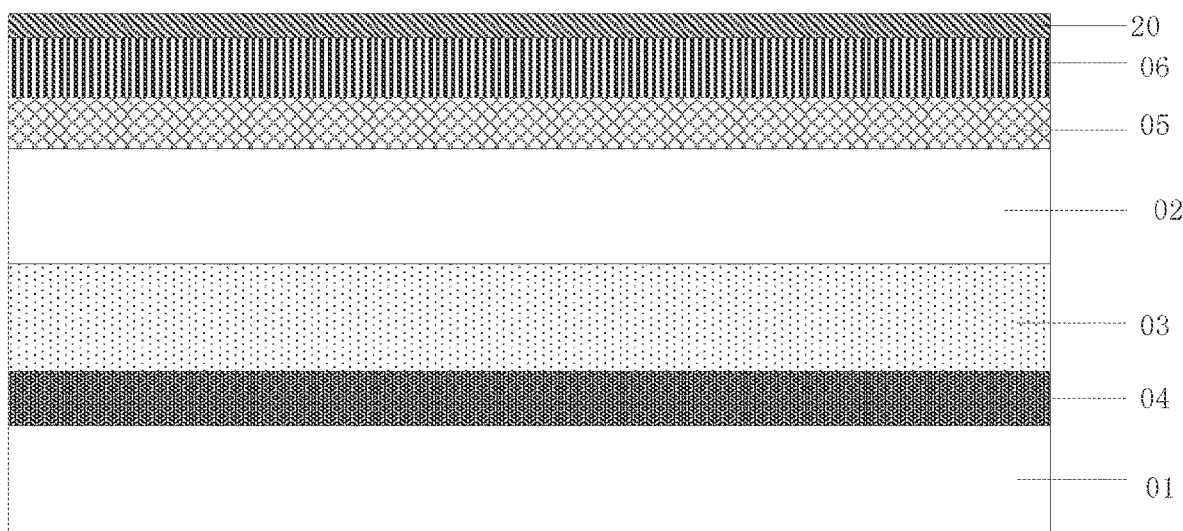
FIG. 15 is a schematic structural diagram of yet another display device provided by an embodiment of the present disclosure.

Accordingly, in the display device provided by the embodiments of the present disclosure, when the polarization filtering structure is the semi-reflecting and semi-transmitting nanowire grid structure, the semi-reflecting and semi-transmitting photonic crystal nanostructure or the semi-reflecting and semi-transmitting metamaterial nanostructure, as shown in FIG. 15, the display device further includes: a packaging layer 20 covering the polarization filtering structure 06, so that the polarization filtering structure 06 is protected against environment abrasion or particulate matters.

Further, in the display device provided by the embodiments of the present disclosure, a refractive index of the packaging layer is smaller than a refractive index of the polarization filtering structure, so as to avoid the packaging layer from affecting optical properties of the polarization filtering structure. During implementation, the greater the difference between the refractive index of the packaging layer and the refractive index of the polarization filtering structure is, the better the effect is.

Accordingly, in the display device provided by the embodiments of the present disclosure, when the polarization filtering structure is at a side, facing the light-emitting pixel array, of the second substrate, since the polarization filtering structure is packaged between the second substrate and the first substrate, the arrangement of the packaging layer may also be omitted.

Accordingly, in the display device provided by the embodiments of the present disclosure, a polarization conversion efficiency of the polarization conversion structure is greater than 40%, so as to ensure the effective utilization of light.

During implementation, there are many ways to realize the polarization conversion structure in the display device provided by the embodiments of the present disclosure. The more mature ones are polarization beam splitter prisms, deflection beam splitters, etc., which are widely used in optics, as well as quarter-wave plate, film design similar to the quarter-wave plate, metamaterials or superstructures, etc., which can achieve the function similar to the quarter-wave plate. Polarization beam splitters and prism films are not suitable for OLED display screens for micro display.

Accordingly, a quarter-wave plate uses the anisotropic characteristics of materials to have different refractive indexes and propagation speeds for light in different polarization directions, resulting in a phase difference of two components, so as to convert linearly polarized light into circularly polarized light, or convert the circularly polarized light into the linearly polarized light. The quarter-wave plate or a similar structure makes the light pass through the wave plate by controlling the refractive index (n) and thickness (t)

of the materials, the light in two polarization directions generates a phase difference of ¼ wavelength, and under the phase difference, the synthesized light is the circularly polarized light. In the display device provided by the embodiments of the present disclosure, after the linearly polarized light passes through the quarter-wave plate, the phase difference of ¼ wavelength is generated between emitting polarization and original polarization, after reflection, the direction and the phase difference of the two components are unchanged, after passing through the quarter-wave plate again, the two components are superimposed with the phase difference of ¼ wavelength, a total of ½ phase difference. Therefore, the light emission is also linearly polarized light, and the polarization direction is perpendicular to the original direction.

Accordingly, since the polarization conversion efficiency of the quarter-wave plate or a dual brightness enhancement film is 50%-90%, optionally, in the display device provided by the embodiment of the present disclosure, the polarization conversion structure may be the quarter-wave plate or the dual brightness enhancement film (DBEF), which is not limited here.

During implementation, the DBEF may adopt a DBEF multilayer structure of a 3M company. In this way, the DBEF multilayer structure may be utilized to directly replace a packaging layer of an existing OLED display device, and a lighter, thinner and more integrated single polarization OLED display device is achieved. In terms of the maturity of technology development, the quarter-wave plate is currently the most well developed and may be directly superimposed for use. Therefore, the specific implementation of the polarization conversion structure may be selected according to actual product application scenario, which is not limited here.

In conclusion, the display device provided by the embodiments of the present disclosure can achieve a display device structure with high light efficiency and single polarization that can be used without changing a process route of the existing display device.

The display device provided by the embodiments of the present disclosure can achieve AR, VR, MR, vehicle-mounted, and light control means structures that are dependent on the polarization state, and may also be applied to the fields of thin and light near-eye display and optical field display.

Based on the same inventive concept, the embodiments of the present disclosure further provide a display apparatus, including the above any display apparatus provided by the embodiments of the present disclosure. The display device may be any products or components with display functions such as a mobile phone, a tablet computer, a television, a monitor, a notebook computer, a digital photo frame, a navigator, etc. The implementation of the display device may refer to the implementation of the above display device, and the repetition will not be repeated.

The display device and the display apparatus provided by the embodiments of the present disclosure, include: the first substrate and the second substrate opposite to the first substrate, the light-emitting pixel array between the first substrate and the second substrate, the reflective plate at the backlight side of the light-emitting pixel array, and the polarization conversion structure and the polarization filtering structure which are successively arranged at the light emission side of the light-emitting pixel array. In this way, after the non-polarized light emitted by the light-emitting pixel array passes through the polarization conversion structure, the non-polarized light is still the non-polarized light, when the non-polarized light reaches the polarization filtering structure, the target polarized light in the non-polarized light conforming to the polarization filtering structure is filtered out of the display device, and the non-target deflected light is reflected back into the display device. The light reflected back into the display device is the non-target deflected light and is the linearly polarized light, the linearly polarized light is converted into the circularly polarized light after passing through the polarization conversion structure. The circularly polarized light is reflected back after reaching the reflective plate, at this time, the reflected light is still the circularly polarized light. The reflected circularly polarized light is converted into the linearly polarized light after passing through the polarization conversion structure, the difference between a polarization direction of the linearly polarized light and the first reflected linearly polarized light is π/2, and the linearly polarized light is just the target polarized light which may be transmitted through the polarization filtering structure. Therefore, the display device provided by the embodiments of the present disclosure can increase the brightness of single polarization light.

Obviously, those skilled in the art can make various changes and modifications to the present disclosure without departing from the spirit and scope of the present disclosure. As such, provided that these modifications and variations of the present disclosure fall within the scope of the claims of the present disclosure and their equivalents, the present disclosure is also intended to cover such modifications and variations.

What is claimed is:
1. A display device, comprising:
a first substrate;
a second substrate opposite to the first substrate;
a light-emitting pixel array between the first substrate and the second substrate;
a reflective plate at a backlight side of the light-emitting pixel array; and
a polarization conversion structure and a polarization filtering structure which are successively arranged at a light emission side of the light-emitting pixel array; wherein the polarization filtering structure is for filtering light emitted from a light-emitting pixel array side to the polarization filtering structure to transmit target polarized light and reflect back non-target deflected light; and
the polarization conversion structure is for converting transmitted circularly polarized light into linearly polarized light, or converting transmitted linearly polarized light into the circularly polarized light;
wherein the polarization filtering structure is a semi-reflecting and semi-transmitting nanowire grid structure, or a semi-reflecting and semi-transmitting photonic crystal nanostructure, or a semi-reflecting and semi-transmitting metamaterial nanostructure; the display device further comprises:
a packaging layer covering the polarization filtering structure;
wherein a refractive index of the packaging layer is smaller than a refractive index of the polarization filtering structure.
2. The display device according to claim 1, wherein the polarization filtering structure is the semi-reflecting and semi-transmitting nanowire grid structure; and
a material of the semi-reflecting and semi-transmitting nanowire grid structure is a metal material.

3. The display device according to claim 2, wherein the material of the semi-reflecting and semi-transmitting nanowire grid structure is aluminum, argentum, *aurum* or cuprum.

4. The display device according to claim 1, wherein a ratio of a wire width to a grating pitch of the semi-reflecting and semi-transmitting nanowire grid structure is 20%-80%.

5. The display device according to claim 4, wherein the grating pitch of the semi-reflecting and semi-transmitting nanowire grid structure is 40 nm, the wire width of the semi-reflecting and semi-transmitting nanowire grid structure is 20 nm, and a wire height of the semi-reflecting and semi-transmitting nanowire grid structure is 200 nm.

6. The display device according to claim 1, wherein a polarization conversion efficiency of the polarization conversion structure is greater than 40%.

7. The display device according to claim 1, wherein the polarization conversion structure is a quarter-wave plate or a dual brightness enhancement film.

8. The display device according to claim 1, wherein the second substrate is at the light emission side of the light-emitting pixel array; and
the polarization conversion structure and the polarization filtering structure are both arranged at a side, facing away from the light-emitting pixel array, of the second substrate, and the polarization conversion structure is between the polarization filtering structure and the second substrate.

9. The display device according to claim 1, wherein the second substrate is at the light emission side of the light-emitting pixel array; and
the polarization conversion structure and the polarization filtering structure are both arranged between the second substrate and the light-emitting pixel array, and the polarization filtering structure is between the polarization conversion structure and the second substrate.

10. The display device according to claim 1, wherein the second substrate is at the light emission side of the light-emitting pixel array;
the polarization filtering structure is at a side, facing away from the light-emitting pixel array, of the second substrate; and
the polarization conversion structure is between the second substrate and the light-emitting pixel array.

11. The display device according to claim 8, further comprising:
a color film layer arranged between the light-emitting pixel array and the second substrate;
the polarization conversion structure and the polarization filtering structure are both arranged at a side, facing the light-emitting pixel array, of the color film layer; or
the polarization conversion structure and the polarization filtering structure are both arranged at a side, facing away from the light-emitting pixel array, of the color film layer; or
the polarization conversion structure is between the color film layer and the light-emitting pixel array, and the polarization filtering structure is at the side, facing away from the light-emitting pixel array, of the color film layer.

12. The display device according to claim 1, wherein the display device is an Organic Light-Emitting Diode (OLED) display device, a mini-LED display device, a micro-LED display device, a quantum dot display device or a reflective display device.

13. A display apparatus, comprising a display device wherein the display device comprises:
a first substrate;
a second substrate opposite to the first substrate;
a light-emitting pixel array between the first substrate and the second substrate;
a reflective plate at a backlight side of the light-emitting pixel array; and
a polarization conversion structure and a polarization filtering structure which are successively arranged at a light emission side of the light-emitting pixel array; wherein
the polarization filtering structure is for filtering light emitted from a light-emitting pixel array side to the polarization filtering structure to transmit target polarized light and reflect back non-target deflected light; and
the polarization conversion structure is for converting transmitted circularly polarized light into linearly polarized light, or converting transmitted linearly polarized light into the circularly polarized light;
wherein the polarization filtering structure is a semi-reflecting and semi-transmitting nanowire grid structure, or a semi-reflecting and semi-transmitting photonic crystal nanostructure, or a semi-reflecting and semi-transmitting metamaterial nanostructure; the display device further comprises:
a packaging layer covering the polarization filtering structure;
wherein a refractive index of the packaging layer is smaller than a refractive index of the polarization filtering structure.

14. The display apparatus according to claim 13, wherein the polarization filtering structure is the semi-reflecting and semi-transmitting nanowire grid structure; and
a material of the semi-reflecting and semi-transmitting nanowire grid structure is a metal material.

15. The display apparatus according to claim 14, wherein the material of the semi-reflecting and semi-transmitting nanowire grid structure is aluminum, argentum, aurum or cuprum.

16. The display apparatus according to claim 13, wherein a ratio of a wire width to a grating pitch of the semi-reflecting and semi-transmitting nanowire grid structure is 20%-80%.

17. The display device according to claim 16, wherein the grating pitch of the semi-reflecting and semi-transmitting nanowire grid structure is 40 nm, the wire width of the semi-reflecting and semi-transmitting nanowire grid structure is 20 nm, and a wire height of the semi-reflecting and semi-transmitting nanowire grid structure is 200 nm.

* * * * *